US009658776B2

United States Patent
Miura

(10) Patent No.: US 9,658,776 B2
(45) Date of Patent: *May 23, 2017

(54) COMPRESSION OF STATE INFORMATION FOR DATA TRANSFER OVER CLOUD-BASED NETWORKS

(71) Applicant: Sony Interactive Entertainment Inc., Tokyo (JP)

(72) Inventor: Victor Octav Suba Miura, Foster City, CA (US)

(73) Assignee: SONY INTERACTIVE ENTERTAINMENT INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/019,891

(22) Filed: Feb. 9, 2016

(65) Prior Publication Data

US 2016/0170658 A1 Jun. 16, 2016

Related U.S. Application Data

(63) Continuation of application No. 14/183,351, filed on Feb. 18, 2014, now Pat. No. 9,258,012.

(Continued)

(51) Int. Cl.
*G06F 3/06* (2006.01)
*H03M 7/30* (2006.01)

(52) U.S. Cl.
CPC ............ *G06F 3/0608* (2013.01); *G06F 3/067* (2013.01); *G06F 3/0661* (2013.01); *H03M 7/30* (2013.01); *H03M 7/3091* (2013.01)

(58) Field of Classification Search
CPC ........ G06F 3/061; G06F 3/0641; G06F 3/067; G06F 7/06; G06F 17/30; G06F 17/30159; G06F 11/1453; H04L 67/1097

(Continued)

(56) References Cited

U.S. PATENT DOCUMENTS 6,009,458 A 12/1999 Hawkins et al.
6,402,620 B1 6/2002 Naghi
(Continued)

FOREIGN PATENT DOCUMENTS

EP 1172132 A 1/2002
EP 1225767 A 7/2002
(Continued)

OTHER PUBLICATIONS

Final Office Action for U.S. Appl. No. 13/631,725, dated Dec. 19, 2014.
(Continued)

*Primary Examiner* — Thanhnga B Truong
(74) *Attorney, Agent, or Firm* — Joshua D. Isenberg; JDI Patent

(57) ABSTRACT

Aspects of the present disclosure describe systems and methods for compressing a set of RAM data that may have some portions duplicated in a set of ROM data. The ROM data may be divided into a plurality of data chunks and hashed to obtained unique key values. Then a second hash may be performed on the RAM to see if there are any RAM data chunks that match the ROM data chunks. RAM data chunks with matching key values are replaced with pointers to the location of the data in the ROM. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims.

18 Claims, 12 Drawing Sheets

Related U.S. Application Data

(60) Provisional application No. 61/794,811, filed on Mar. 15, 2013.

(58) Field of Classification Search
USPC .................. 713/193; 707/692, 705; 711/154
See application file for complete search history.

(56) References Cited

U.S. PATENT DOCUMENTS

| | | |
|---|---|---|
| 7,159,008 B1 | 1/2007 | Wies et al. |
| 7,286,132 B2 | 10/2007 | Kuhne |
| 7,470,196 B1 | 12/2008 | Joshi |
| 7,493,365 B2 | 2/2009 | Wies et al. |
| 8,321,571 B2 | 11/2012 | Crowder, Jr. et al. |
| 8,935,487 B2 * | 1/2015 | Sengupta ............ G06F 12/0862 707/692 |
| 9,248,374 B2 | 2/2016 | Watson et al. |
| 9,258,012 B2 | 2/2016 | Miura |
| 2002/0002510 A1 | 1/2002 | Sharp et al. |
| 2002/0045484 A1 | 4/2002 | Eck et al. |
| 2002/0065915 A1 | 5/2002 | Anderson et al. |
| 2003/0037030 A1 | 2/2003 | Dutta et al. |
| 2003/0190950 A1 | 10/2003 | Matsumoto |
| 2003/0225560 A1 | 12/2003 | Garcia et al. |
| 2004/0179019 A1 | 9/2004 | Sabella et al. |
| 2004/0224772 A1 | 11/2004 | Canessa et al. |
| 2004/0266529 A1 | 12/2004 | Chatani |
| 2005/0195187 A1 | 9/2005 | Seiler et al. |
| 2005/0288954 A1 | 12/2005 | McCarthy et al. |
| 2006/0009290 A1 | 1/2006 | Taho et al. |
| 2006/0080702 A1 | 4/2006 | Diez et al. |
| 2006/0117260 A1 | 6/2006 | Sloo et al. |
| 2006/0146057 A1 | 7/2006 | Blythe |
| 2006/0160626 A1 | 7/2006 | Gatto et al. |
| 2006/0259292 A1 | 11/2006 | Solomon et al. |
| 2007/0060361 A1 | 3/2007 | Nguyen et al. |
| 2007/0298866 A1 | 12/2007 | Gaudiano et al. |
| 2008/0032794 A1 | 2/2008 | Ware et al. |
| 2008/0113749 A1 | 5/2008 | Williams et al. |
| 2008/0282241 A1 | 11/2008 | Dong |
| 2008/0300053 A1 | 12/2008 | Muller |
| 2009/0082102 A1 | 3/2009 | Sargaison et al. |
| 2009/0088236 A1 | 4/2009 | Laude et al. |
| 2009/0098943 A1 | 4/2009 | Weber et al. |
| 2009/0282139 A1 | 11/2009 | Mejdrich et al. |
| 2009/0303245 A1 | 12/2009 | Soupikov et al. |
| 2010/0088296 A1* | 4/2010 | Periyagaram ........... G06F 3/061 707/705 |
| 2010/0259536 A1 | 10/2010 | Toksvig et al. |
| 2011/0013699 A1 | 1/2011 | Persson |
| 2011/0098111 A1 | 4/2011 | Saito et al. |
| 2011/0218037 A1 | 9/2011 | Singh |
| 2011/0299105 A1 | 12/2011 | Morrison et al. |
| 2012/0021840 A1 | 1/2012 | Johnson et al. |
| 2012/0052930 A1 | 3/2012 | Mcgucken |
| 2012/0142425 A1 | 6/2012 | Scott et al. |
| 2012/0299940 A1 | 11/2012 | Dietrich et al. |
| 2013/0137518 A1 | 5/2013 | Lucas |
| 2014/0004941 A1 | 1/2014 | Watson et al. |
| 2014/0004949 A1 | 1/2014 | Miura et al. |
| 2014/0004956 A1 | 1/2014 | Miura et al. |
| 2014/0004957 A1 | 1/2014 | Stine et al. |
| 2014/0004962 A1 | 1/2014 | Miura et al. |
| 2014/0066177 A1 | 3/2014 | Zalewski |
| 2014/0092087 A1 | 4/2014 | Kazama et al. |
| 2014/0094299 A1 | 4/2014 | Stine et al. |
| 2014/0094313 A1 | 4/2014 | Watson et al. |
| 2014/0094314 A1 | 4/2014 | Watson et al. |
| 2014/0094315 A1 | 4/2014 | Stine et al. |

FOREIGN PATENT DOCUMENTS

| | | |
|---|---|---|
| JP | 2009072601 A | 4/2009 |
| JP | 2012034793 A | 2/2012 |
| RU | 2364938 C2 | 8/2009 |
| WO | 2004024259 A | 3/2004 |

OTHER PUBLICATIONS

Final Office Action for U.S. Appl. No. 13/631,740, dated Jul. 27, 2015.
Final Office Action for U.S. Appl. No. 13/631,785, dated Dec. 4, 2015.
Final Office Action for U.S. Appl. No. 13/631,803, dated Feb. 1, 2016.
Final Office Action for U.S. Appl. No. 13/631,812, dated Aug. 29, 2014.
Final Office Action for U.S. Appl. No. 13/790,320, dated Feb. 10, 2016.
Final Office Action for U.S. Appl. No. 13/790,320, dated Jan. 15, 2015.
Final Office Action for U.S. Appl. No. 13/791,379, dated May 13, 2015.
Final Office Action for U.S. Appl. No. 13/791,420, dated Jun. 11, 2014.
Final Office Action for U.S. Appl. No. 13/791,420, dated Oct. 9, 2015.
Final Office Action for U.S. Appl. No. 13/791,434, dated Feb. 17, 2016.
Final Office Action for U.S. Appl. No. 13/791,434, dated Jun. 23, 2015.
Final Office Action for U.S. Appl. No. 13/631,803, dated Apr. 16, 2015.
Final Office Action for U.S. Appl. No. 13/790,311, dated Mar. 27, 2015.
Grand Theft Auto: San Andreas Guide—Territories, https://www.youtube.com/watch?v=5d2GY-gr, May 29, 2012.
GTA San Andreas How to start a gang war, https://www.youtube.com/watch?v=9N4908kGtLO, Jan. 13, 2013.
International Search Report and Written Opinion for International Application No. PCT/US2013/074813, dated May 29, 2014.
Japanese Office Action for Japan Code Application No. 2015-517495, dated Feb. 9, 2016.
Non Final Office Action for U.S. Appl. No. 13/790,311 dated Jun. 27, 2013 6 pages.
Non-Final Office Action for U.S. Appl. No. 13/631,725, dated Mar. 16, 2015.
Non-Final Office Action for U.S. Appl. No. 13/631,725, dated Sep. 12, 2014.
Non-Final Office Action for U.S. Appl. No. 13/631,740, dated Oct. 21, 2014.
Non-Final Office Action for U.S. Appl. No. 13/631,812, dated Mar. 28, 2014.
Non-Final Office Action for U.S. Appl. No. 13/790,311, dated Feb. 26, 2014.
Non-Final Office Action for U.S. Appl. No. 13/790,311, dated Jun. 27, 2013.
Non-Final Office Action for U.S. Appl. No. 13/790,311, dated Sep. 9, 2014.
Non-Final Office Action for U.S. Appl. No. 13/790,320, dated Jun. 18, 2014.
Non-Final Office Action for U.S. Appl. No. 13/791,379, dated Mar. 27, 2014.
Non-Final Office Action for U.S. Appl. No. 13/791,420, dated Mar. 27, 2014.
Non-Final Office Action for U.S. Appl. No. 13/792,664, dated Jun. 23, 2014.
Non-Final Office Action for U.S. Appl. No. 13/791,434, dated Nov. 26, 2014.
Non-Final Office Action for U.S. Appl. No. 13/631,740, dated Feb. 27, 2015.

(56) References Cited

OTHER PUBLICATIONS

Non-Final Office Action for U.S. Appl. No. 13/631,785, dated May 21, 2015.
Non-Final Office Action for U.S. Appl. No. 13/631,803, dated Sep. 17, 2015.
Non-Final Office Action for U.S. Appl. No. 13/790,311, dated Nov. 19, 2015.
Non-Final Office Action for U.S. Appl. No. 13/790,320, dated Jul. 28, 2015.
Non-Final Office Action for U.S. Appl. No. 13/791,420, dated Apr. 9, 2015.
Non-Final Office Action for U.S. Appl. No. 14/183,351, dated May 11, 2015.
Non-Final Office Action for U.S. Appl. No. 13/631,785, dated Oct. 22, 2014.
Non-Final Office Action for U.S. Appl. No. 13/631,803, dated Oct. 14, 2014.
Non-Final Office Action for U.S. Appl. No. 13/791,379, dated Oct. 16, 2014.
PCT International Search Report and Written Opinion for International Application No. PCT/US2013/061023, dated Jan. 23, 2014.
PCT International Search Report and Written Opinion for International Application No. PCT/US2013/061029, dated Jan. 23, 2014.
Playstation2, 2004, Grand Theft Auto—San Andreas.
U.S. Appl. No. 61/666,628, to Victor Octav Suba Miura, filed Jun. 29, 2012.
U.S. Appl. No. 61/666,645, to Victor Octav Suba Miura, filed Jun. 29, 2012.
U.S. Appl. No. 61/666,665, to Brian Michael Christopher Watson, filed Jun. 29, 2012.
U.S. Appl. No. 61/666,679, to Jacob P. Stine, filed Jun. 29, 2012.
U.S. Appl. No. 61/694,718, to Gary M. Zalewski, filed Aug. 29, 2012.
U.S. Appl. No. 61/794,811, to Victor Octav Suba Miura, filed Mar. 15, 2013.
Non-Final Office Action for U.S. Appl. No. 13/631,812, dated Jun. 3, 2016.
Non-Final Office Action for U.S. Appl. No. 13/791,379, dated Jul. 1, 2016.
Final Office Action for U.S. Appl. No. 13/790,311, dated Jul. 15, 2016.

* cited by examiner

COMPRESSION OF STATE INFORMATION FOR DATA TRANSFER OVER CLOUD-BASED NETWORKS

CLAIM OF PRIORITY

This application is a continuation of U.S. patent application Ser. No. 14/183,351, now U.S. Pat. No. 9,258,012, filed Feb. 18, 2014, the entire disclosures of which are incorporated herein by reference.

U.S. patent application Ser. No. 14/183,351 claims the priority benefit of U.S. Provisional Patent Application No. 61/794,811, filed Mar. 15, 2013, the entire disclosures of which are incorporated herein by reference.

FIELD OF THE DISCLOSURE

The present disclosure is related to data compression. Among other things, this application describes a method and apparatus for compressing the state information of a media application so it may be readily transferred over a network.

BACKGROUND OF THE INVENTION

Media applications, such as video games, typically require both a read only memory (ROM) and a random access memory (RAM). All of the data that is needed to run the media application is stored on the ROM, but during the execution of the media application, portions of the data from the ROM may be stored in the RAM so they can be accessed faster and more efficiently. The information that is stored in the RAM may also include all of the state information. The state information includes all of the information that is needed to run the media title from a certain point in its execution. By way of example, the state information may include data that defines the state of every component of a client device platform, such as a gaming console or computer, that is being used to execute and display the media application. By way of example, and not by way of limitation, the state information may include the information regarding the state of a CPU, GPU, memory, register values, program counter value, programmable DMA state, buffered data for the DMA, audio chip state, and CD-ROM state. Typically, the amount of data needed to sufficiently define the present state of a media application is relatively large. For example, in a video game there may be approximately 8 GB of data stored in the RAM that represents the complete set of state information.

Previously, the large amount of data needed to adequately define the state information was not a problem because the data was never saved or transferred from the RAM. However, there is a growing need for the ability to transfer the state information. For example, the state information may sometimes be transferred over a network to a cloud based server, e.g., during cloud-based emulation of software titles. In these situations, it may not be practical to transfer several gigabytes of data. Alternatively, there are needs for saving the state information for subsequent uses locally. For example, when a gaming console is put into a power saving "sleep" mode it may not be practical to maintain the entire contents of the RAM in order to resume the gameplay from the present location.

As such, there is a need in the art for systems and apparatuses that allow for the state information to be compressed into a less data intensive format. It is within this context that aspects of the present disclosure arise.

DETAILED DESCRIPTION OF THE DRAWINGS

Although the following detailed description contains many specific details for the purposes of illustration, anyone of ordinary skill in the art will appreciate that many variations and alterations to the following details are within the scope of the present disclosure. Accordingly, the aspects of the present disclosure described below are set forth without any loss of generality to, and without imposing limitations upon, the claims that follow this description.

Aspects of the present disclosure describe systems and methods that facilitate the compression of application state data. As used herein, application state data is the complete set of data that is needed by a client device platform to reproduce a given scenario in a media application. Typically, the application state data of is obtained by saving the random access memory (RAM) of the client device platform. The large amount of data in the RAM that needs to be saved in order to adequately define the state of the client device platform may be compressed by using data that is stored in a read only memory (ROM) as a library. Typically, there is substantial overlap in the data present in the RAM and the data stored in the ROM. For example, in a video game approximately 50% or more of the data in the RAM at a given time may also be found in the ROM. By way of example, and not by way of limitation, there may be textures, three dimensional models, or in game animations stored in the RAM during the execution of the media application. These types of data are also found on the ROM. Since the ROM does not change over time, the portions of the data in the RAM that are also found in the ROM may be replaced with a pointer to their corresponding locations in the ROM instead of the actual data. Therefore the amount of data needed to adequately define the state of the client device platform may be reduced by the cross-referencing back to the ROM.

Figure 1:
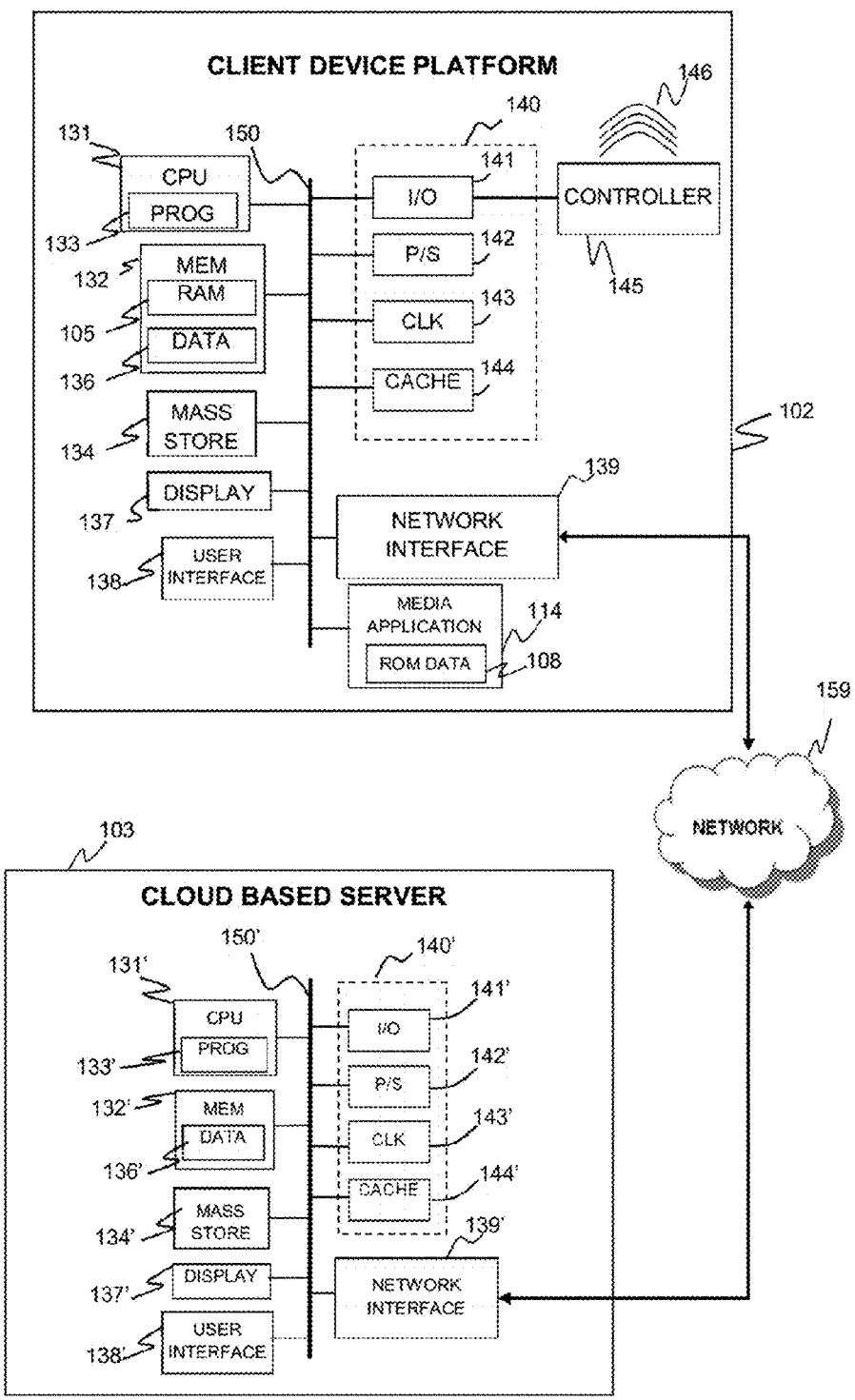
FIG. 1 is a schematic diagram of a client device platform and a cloud based server communicating over a network according to an aspect of the present disclosure.

FIG. 1 is a schematic of an embodiment of the present invention. The client device platform 102 may be accessed by a cloud based server 103 over a network 159. Cloud based server 103 may access alternative client device platforms 102 over the network 159.

The client device platform 102 may include a central processor unit (CPU) 131. By way of example, a CPU 131 may include one or more processors, which may be configured according to, e.g., a dual-core, quad-core, multi-core, or Cell processor architecture. The client device platform 102 may also include a memory 132 (e.g., RAM, DRAM, ROM, DROM, and the like). The CPU 131 may execute a process-control program 133, portions of which may be stored in the memory 132. The client device platform 102 may also include well-known support circuits 140, such as input/output (I/O) circuits 141, power supplies (P/S) 142, a clock (CLK) 143 and cache 144. The client device platform 102 may optionally include a mass storage device 134 such as a disk drive, CD-ROM drive, tape drive, or the like to store programs and/or data. The client device platform 102 may also optionally include a display unit 137 and user interface unit 138 to facilitate interaction between the client device platform 102 and a user who requires direct access to the client device platform 102. The display unit 137 may be in the form of a cathode ray tube (CRT) or flat panel screen that displays text, numerals, or graphical symbols. The user interface unit 138 may include a keyboard, mouse, joystick, light pen, or other device. A controller 145 may be connected to the client device platform 102 through the I/O circuit 141 or it may be directly integrated into the client device platform 102. The controller 145 may facilitate interaction between the client device platform 102 and a user. The controller 145 may include a keyboard, mouse, joystick, light pen, hand-held controls or other device. The controller 145 may also be capable of generating a haptic response 146. By way of example and not by way of limitation, the haptic response 146 may be vibrations or any other feedback corresponding to the sense of touch.

The client device platform 102 may include a network interface 139, configured to enable the use of Wi-Fi, an Ethernet port, or other communication methods. The network interface 139 may incorporate suitable hardware, software, firmware or some combination of two or more of these to facilitate communication via the electronic communications network 159. The network interface 139 may be configured to implement wired or wireless communication over local area networks and wide area networks such as the Internet. The client device platform 102 may send and receive data 136 and/or requests for files via one or more data packets over the network 159.

The preceding components may exchange signals with each other via an internal system bus 150. The client device platform 102 may be a general purpose computer that becomes a special purpose computer when running code that implements embodiments of the present invention as described herein. By way of example, and not by way of limitation, the client device platform 102 may be a gaming console, a set top box, a cable box, a personal computer, a tablet computer, a telephone, a cell phone, a DVD player, a Blu-Ray player, a digital video recorder (DVR), or other similar devices, or any combination thereof. By way of example, and not by way of limitation, with respect to gaming consoles, the client device platform 102 may be a portable gaming console, such as the PlayStation Vita available from Sony Computer Entertainment, or it may be a stationary console such as the PlayStation 4 or any other earlier versions available from Sony Computer Entertainment.

Client device platform 102 may access a media application 114 that has been selected by a user for execution. There may be more than one media application 114 stored in the client device 102. The media applications may also be stored in the memory 132 or in the mass storage device 134. Additionally, one or more media applications 114 may be stored at a remote location accessible to the client device platform 102 over the network 159. By way of example, and not by way of limitation, the media applications may be a video game. Each media application 114 contains ROM data 108 that is stored in read only memory (ROM). When the media application 114 is executed, the ROM data 108 is used by the client device platform 102 in order to display the media application 114 to the user. The client device platform 102 may use a random access memory (RAM) 105 to store portions of the ROM data 108 during execution of the media application 114.

Cloud based server 103 may include a central processor unit (CPU) 131'. By way of example, a CPU 131' may include one or more processors, which may be configured according to, e.g., a dual-core, quad-core, multi-core, or Cell processor architecture. Cloud based server 103 may also include a memory 132' (e.g., RAM, DRAM, ROM, DROM, and the like). The CPU 131' may execute a process-control program 133', portions of which may be stored in the memory 132'. The cloud based server 103 may also include well-known support circuits 140', such as input/output (I/O) circuits 141', power supplies (P/S) 142', a clock (CLK) 143' and cache 144'. The cloud based server 103 may optionally include a mass storage device 134' such as a disk drive, CD-ROM drive, tape drive, or the like to store programs and/or data. The cloud based server 103 may also optionally include a display unit 137' and a user interface unit 138' to facilitate interaction between the cloud based server 103 and a user who requires direct access to the cloud based server 103. The display unit 137' may be in the form of a cathode ray tube (CRT) or flat panel screen that displays text, numerals, or graphical symbols. The user interface unit 138' may include a keyboard, mouse, joystick, light pen, or other device. The cloud based server 103 may include a network interface 139', configured to enable the use of Wi-Fi, an Ethernet port, or other communication methods.

The network interface 139' may incorporate suitable hardware, software, firmware or some combination of two or more of these to facilitate communication via an electronic communications network 159. The network interface 139' may be configured to implement wired or wireless communication over local area networks and wide area networks such as the Internet. The cloud based server 103 may send and receive data 136' and/or requests for files via one or more data packets over the network 159'.

The preceding components may exchange signals with each other via an internal system bus 150'. The cloud based server 103 may be a general purpose computer that becomes a special purpose computer when running code that implements embodiments of the present invention as described herein. By way of example, the cloud based server 103 may also be implemented as a virtual machine.

Figure 2A:
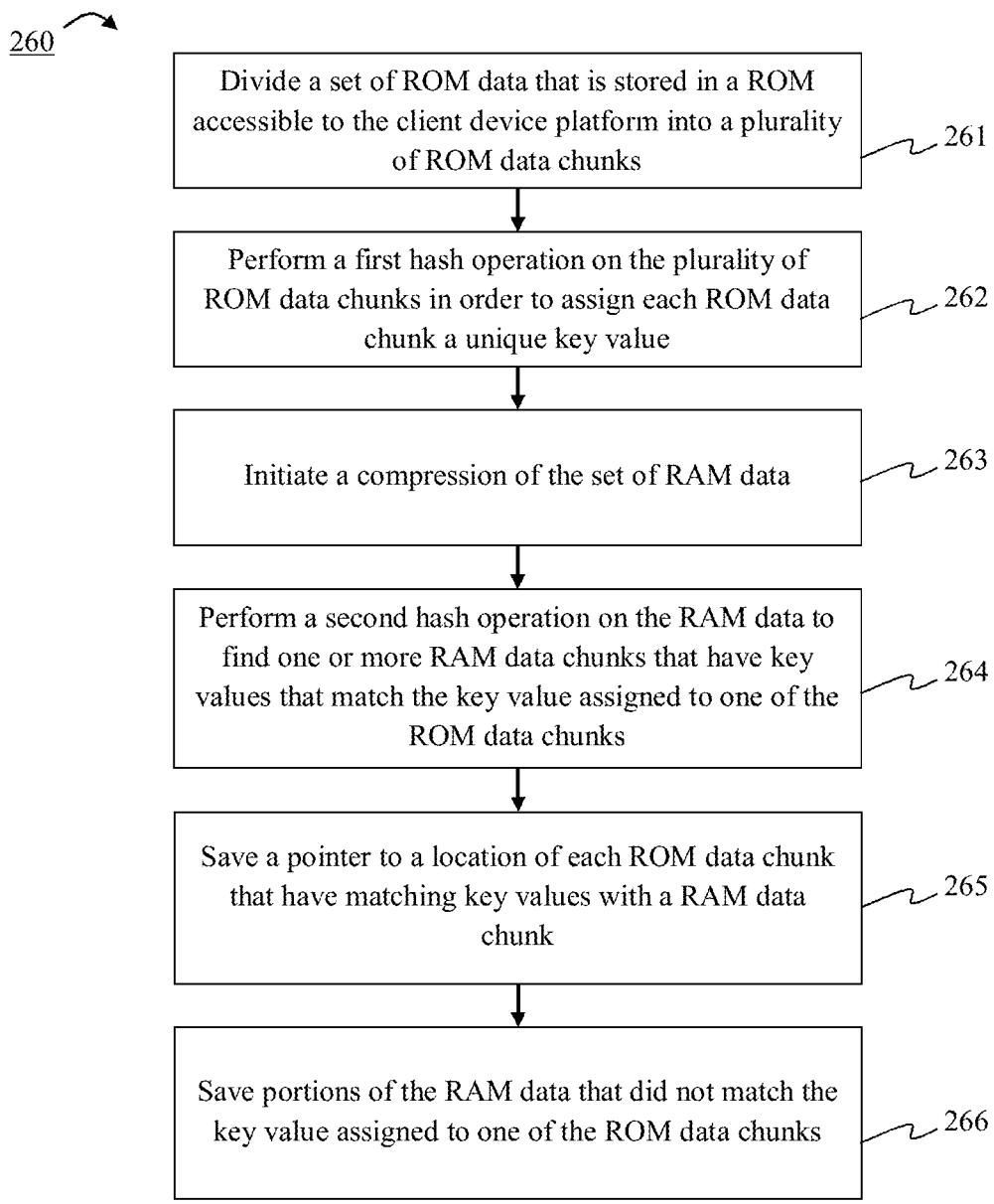
FIGS. 2A-2D are flow diagrams that describe methods for compressing the state information of a media application according to aspects of the present disclosure.
Figure 2B:
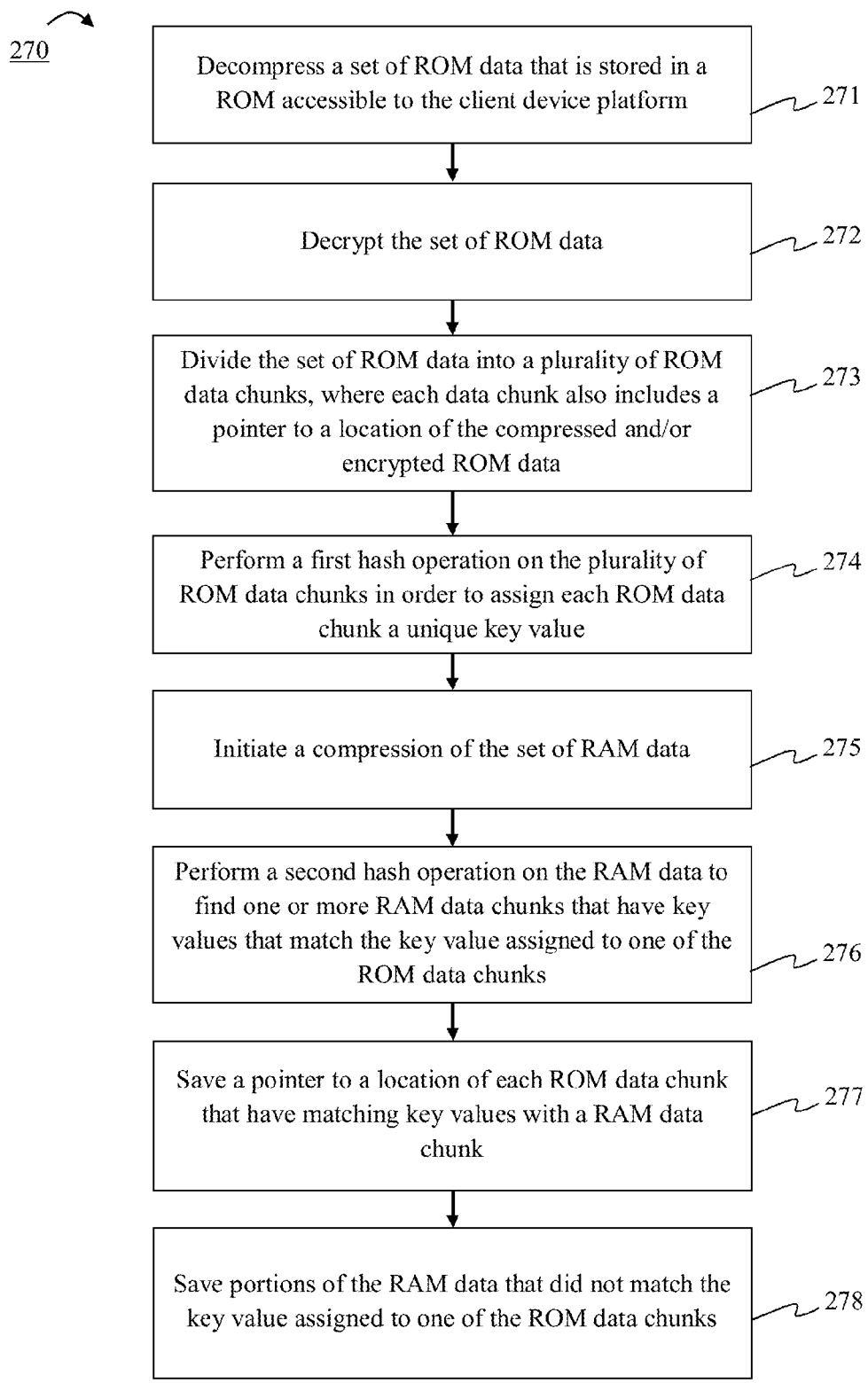

As shown in FIG. 2A, the client device platform 102 may be configured to implement a method for compressing a set of RAM data that is stored in a RAM accessible to the client device platform according to an inventive method 260. First at 261 a set of ROM data 308 that is stored in a ROM 308 accessible to the client device platform 102 is divided into a plurality of ROM data chunks 307. The ROM data 308 may be the ROM data 108 of the media application 114.

Figure 3A:
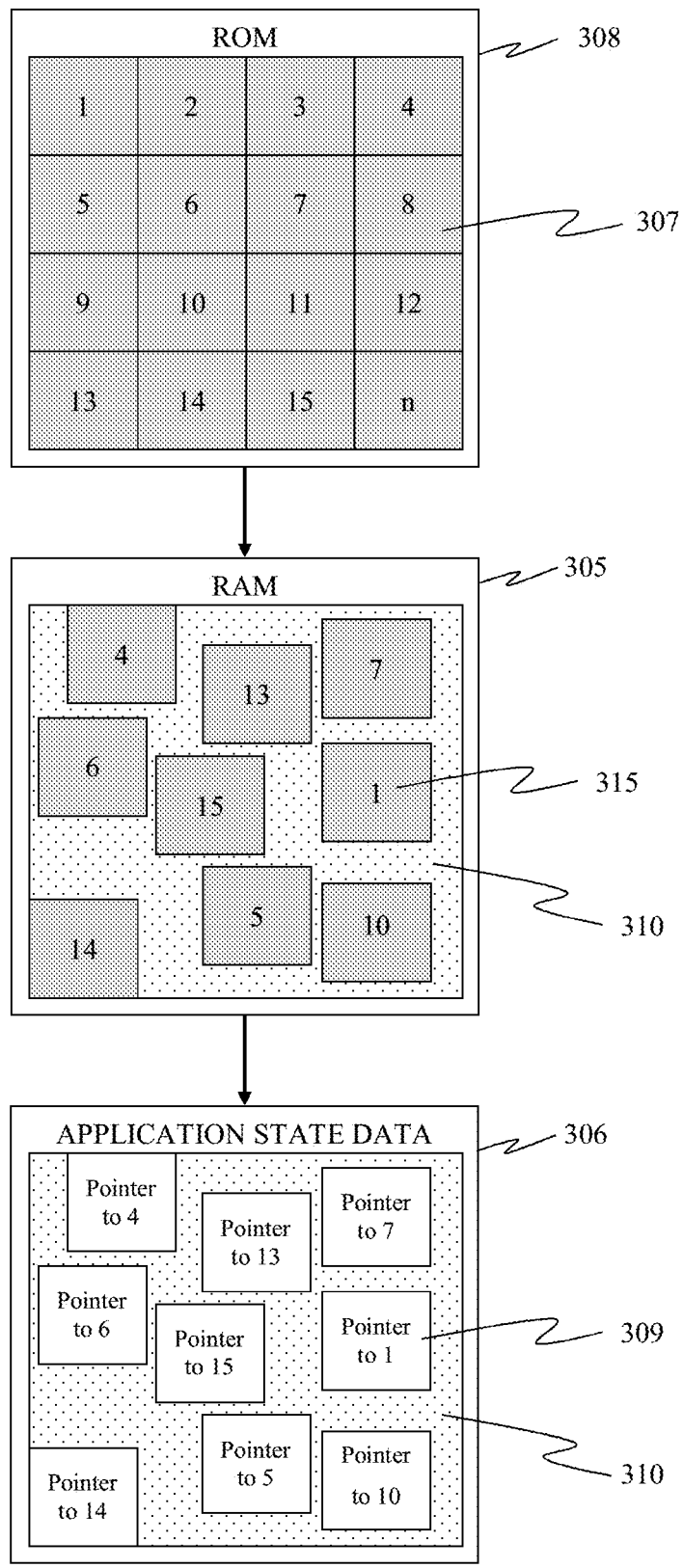
FIGS. 3A-3C are block diagrams that depict a simplified version of the hashing processes that may be performed on portions of memory according to aspects of the present disclosure.
Figure 3B:
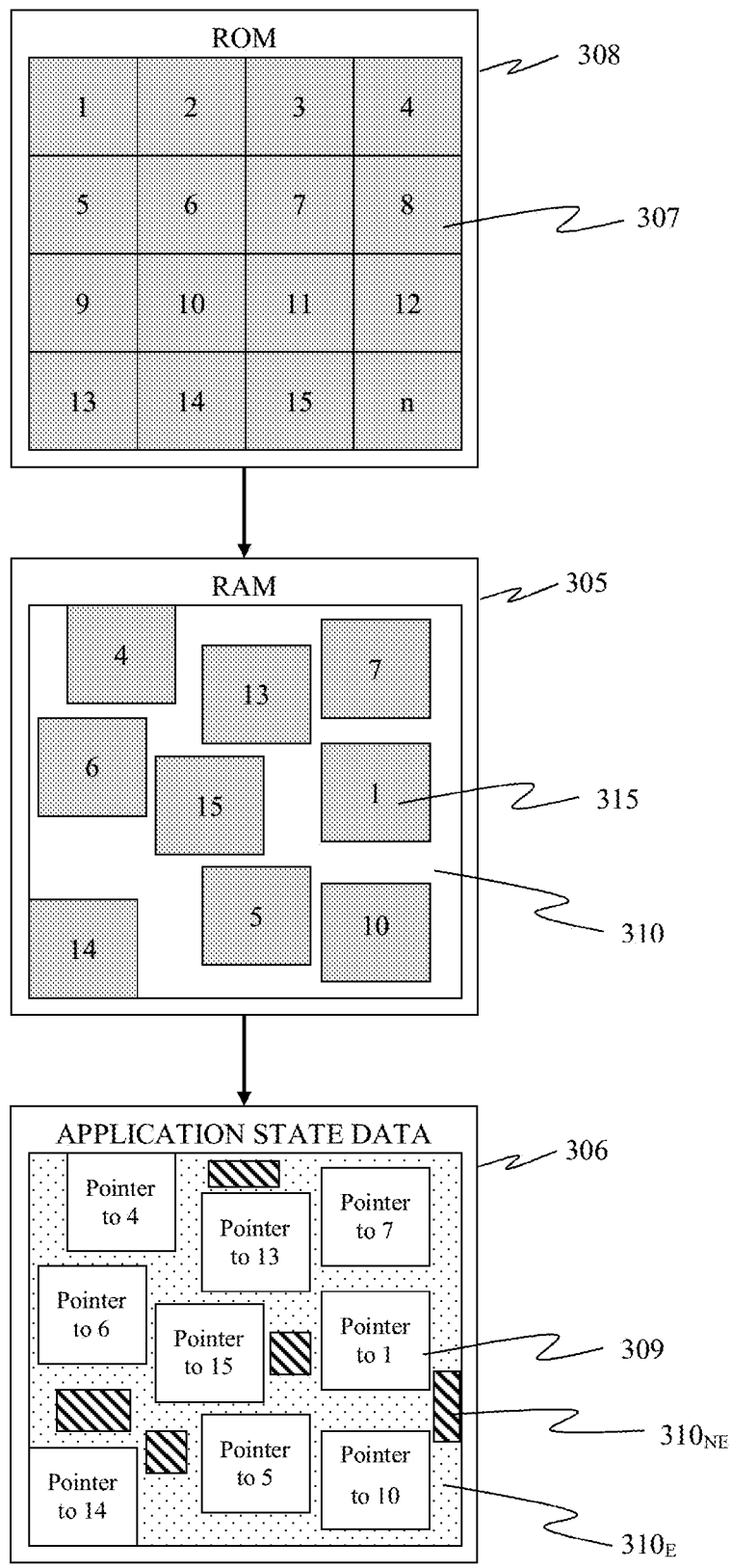

FIG. 3A is a simplified block diagram that may be useful in visualizing the process. As may be seen, the ROM data 308 may be divided into a plurality (1, 2, 3, . . . , n) of ROM data chunks 307. The decision of how large to make each of the ROM data chunks 307 may be made by balancing competing factors. For example, larger ROM data chunks 307 typically require fewer hash keys, and therefore require less memory space for storing them. However, if the ROM data chunks 307 are too large, then the probability of finding matching data chunks in the RAM is decreased. Preferably, but not necessarily, each ROM data chunk 307 may be between approximately 50 KB and 1 MB in size. This is a useful range because it provides sufficient granularity for subsequent hashing processes without having to dedicate too much memory for the storage of the hash key values needed for the hashing process. As an example, if the ROM 308 is 25 GB, then 1 MB data chunks would require 25 thousand hash key values, and data chunks 307 that are 50 kB would require 500 thousand hash key values. Assuming a 32-bit hash of four bytes each, even the smaller ROM data chunks 307 would only require 2 MB of storage for the key values.

Once the proper size of each ROM data chunk 307 has been determined, method 260 may continue by performing a first hash operation on the ROM data chunks 307 in order to assign each one a unique key value at 262. Since the ROM data 308 is read-only there will not be changes to the data, and the same key values may be used for any subsequent compression operation. Therefore, once the ROM data 308 has been divided into ROM data chunks 307 and hashed to produce key values, there is no need to hash the ROM data 308 again.

Thereafter, at block 263 a compression operation of the RAM 305 is initiated. There may be many different ways for initiating the compression of the RAM 305. For example, a user playing the media application 114 may initiate the compression operation by suspending the media application 114 at a given point in the application. By way of example, when the media application 114 is a video game, then the user may desire to suspend the game midway through a level. In order to allow the user to resume from the same position in the level at a later time, the client device platform 102 may save the application state information 306. Additionally, the compression operation may be initiated by placing the client device platform in a "sleep" mode during the execution of the media application 114. Instead of having to save the entire state of the device for when the client device platform is turned back on, a compressed version of the state information may be desired. Also, a user may desire to port a game they are currently playing to another device. By way of example, and not by way of limitation, a user may be playing a media application 114 on a PlayStation 4 console, and may desire to port the game to a PlayStation Vita. An action initiating the port of the media application 114 may also initiate the compression operation. As such, the suspension of the media application 114 by the user in order to pause the application, put the client device platform into a "sleep" mode, or in order to port the media application to a second device may initiate the compression operation in order to produce application state data 306 that is a compressed version of the RAM 305. The application state data 306 may include pointers to portions of the ROM data 308 for which the values are not different from the values stored in ROM and values of data from ROM that have been changed.

As a second example, the compression operation may be initiated when the application state data 306 is generated in order to be delivered over a network connection 159. When delivered over a network, the size of the application state data 306 may be preferable and the compression operation may therefore be desirable. By way of example, and not by way of limitation, the application state data 306 may be delivered over a network for various reasons. One such reason is to provide a snapshot to the cloud-based server 103. Snapshots and their uses are described in greater detail in commonly-assigned, co-pending application Ser. No. 13/791,379, filed Mar. 8, 2013, and entitled "SUSPENDING STATE OF CLOUD-BASED LEGACY APPLICATIONS", the entire disclosures of which are incorporated herein by reference, and in commonly-assigned, co-pending application Ser. No. 13/631,725, filed Sep. 28, 2012, and entitled "REPLAY AND RESUMPTION OF SUSPENDED GAME" to Brian Michael Christopher Watson, Victor Octav Suba Miura, Jacob P. Stine and Nicholas J. Cardell, the entire disclosures of which are incorporated herein by reference.

Additionally, the use of compressed application state data 306 may be used to facilitate streaming a media application 114 over a cloud based network 159. Instead of constantly sending the complete set of RAM data 305 over the network, the compressed application state data 306 may be utilized in order to reduce the bandwidth needed for streaming the game.

It is noted that compression of the application state data 306 as described is useful for cloud-based applications where the state data is transmitted over a network from one device (e.g., a client device) to another (e.g., a server). However, aspects of the present disclosure are not limited to such implementations, alternatively, compressing the application state data as described herein is useful, e.g., for suspending multiple applications (e.g., multiple games) simultaneously on a game console in less storage space.

Next, a second hashing operation may be performed on the set of RAM data 305 to find one or more RAM data chunks 315 that have key values that match the key value assigned to one of the ROM data chunks 307 at block 264. However, since the second hashing operation is performed on random access memory, the RAM data chunks 315 are not at a fixed position, and may have an unknown offset value. As such, the second hashing operation may include an algorithm that is capable of detecting matching blocks at variable offsets. As may be seen in FIG. 3A, there are several RAM data chunks 315 that were identified by the second hashing operation, as having a key value that matched one of the ROM data chunks 307. In order to have matching key values the ROM data chunks 307 and the RAM data chunks 315 must contain the same data. Therefore, the matching chunks represent information that has not changed between the ROM and the RAM. Since the data contained within the RAM data chunks 315 is available elsewhere, it is not necessary to duplicate the information when generating the application state data 306.

In order to avoid the duplication of the data, method 260 may continue by saving a pointer 309 to the location of each ROM data chunk 307 that has a corresponding RAM data chunk 315 with a matching key value at block 265. Thereafter, the RAM data 310 that did not match a key value assigned to one of the ROM data chunks 307 may be saved as the application state data 306 in order to provide the complete state of the client device platform at block 266.

According to an additional aspect of the present disclosure, there may need to be extra steps taken according to a method 270 when the ROM data 308 is compressed and/or encrypted. First, if the ROM data 308 is compressed, a decompression operation is performed on the ROM data 308 at block 271. Additionally, if the ROM data 308 is encrypted, then at block 272, the data is decrypted. It should be noted that if the ROM data is compressed, but not encrypted, then only the decompression operation needs to be performed. Alternatively, if the ROM data 308 is encrypted, but not compressed, then only the decryption of the data needs to be performed.

Once the ROM data 308 has be transformed into an unencrypted and uncompressed form, method 270 may continue at block 273 by dividing the set of ROM data into a plurality of ROM data chunks 307, where each data chunk 307 also includes a pointer location to the location in the compressed and/or encrypted data where the data chunk 307 originated from. The pointer that indicates the original location in the compressed and/or encrypted data is needed because the compressed and/or encrypted data is the set of data that will be used as the reference when analyzing the application state data 306. Thereafter, blocks 274 through 278 of method 270 continue following substantially the same steps as described in blocks 262 through 266 of method 260.

Figure 2C:
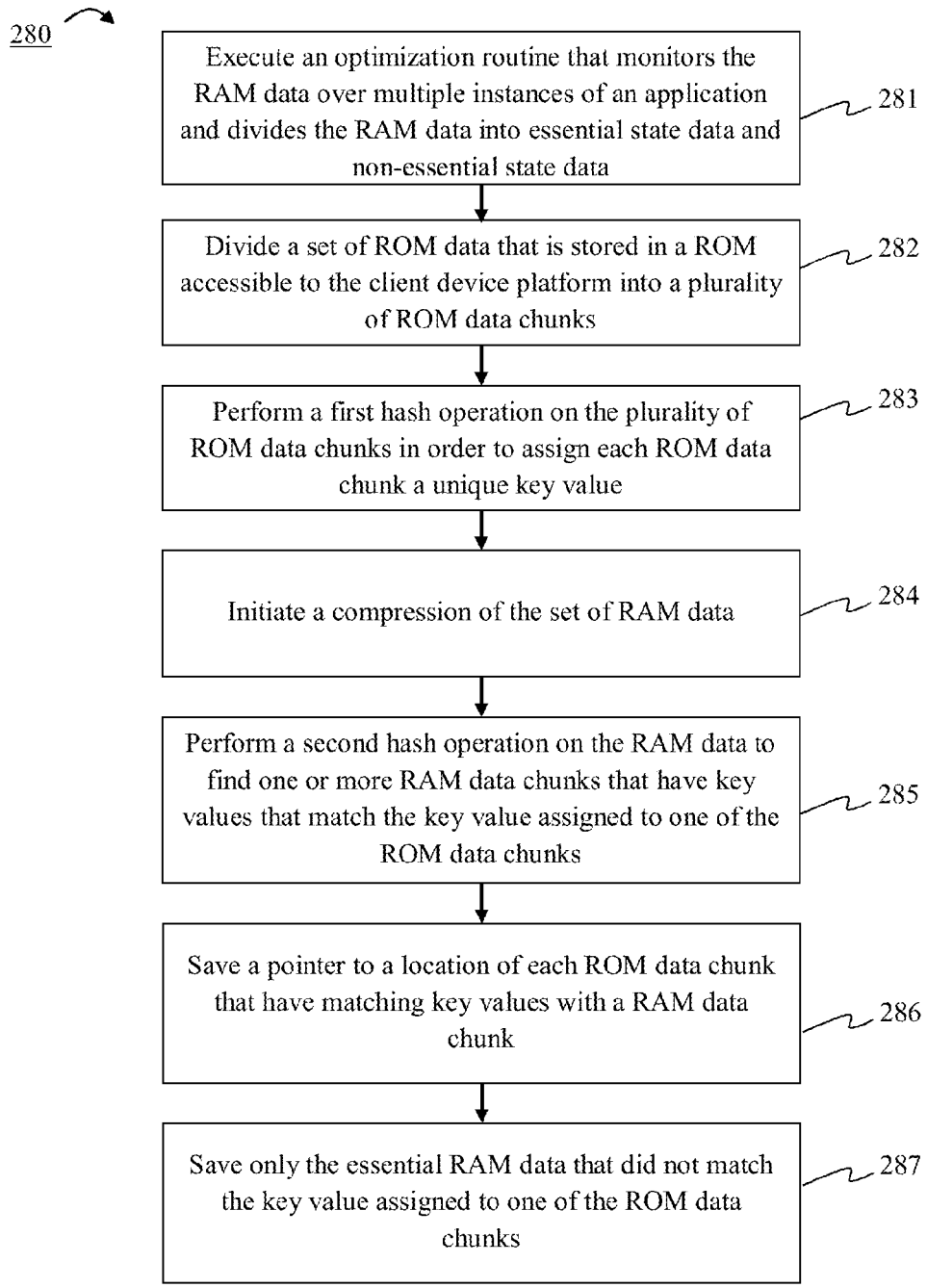

According to another additional aspect of the present disclosure, machine learning may be implemented in order to provide improved compression of the RAM data 305. Method 280 shown in FIG. 2C describes a method that may be used to improve the compression with machine learning. First, at block 281 the method begins by executing an optimization routine that monitors the RAM data 305 over multiple instances of an application and divides the RAM data 305 into essential state data $310_E$ and non-essential state data $310_{NE}$. The optimization routine may be run offline before the media application 114 is released to consumers. By way of example, the media application 114 may be run through a plurality of simulations. During the simulations, the RAM data 305 may be closely monitored to determine which portions of the RAM data 305 are essential for creating an application state data set 306 that fully defines the state of a client device platform 102 at a given point during the execution of the media application 114. By way of example, and not by way of information, certain information, such as a display list, may not be necessary if the frame that the display list is for is not needed to adequately define the state of the client device platform. Additionally, intermediate processing steps for animations may not be essential data. For example, in a graphics processing operation the GPU may need to read one texture and then output a second texture that depends from the first texture. If this relationship is determined through the optimization process then the essential data (the second texture that is the output) may be saved without needing to save the intermediate data that is generated in order to produce this output. Once the RAM data has been identified as non-essential data, blocks 282 through 286 of method 260 continue, following in substantially the same steps described in blocks 262 through 265 of method 260. At block 287, only the essential RAM data $310_E$ that did not match a key value assigned to one of the ROM data chunks is saved as part of the application state data 306. The exclusion of the non-essential RAM data $310_{NE}$ allows for further compression of the RAM data 308.

As mentioned previously, when the size of each ROM data chunks 307 is larger, then the amount of memory that needs to be allocated for maintaining the key values is reduced. However, this also reduces the probability of finding a matching RAM data chunk 315, because if a single byte is different, then the hashing operation will not detect it as a match. Therefore, aspects of the present disclosure are directed to increasing the likelihood of finding matching chunks between the ROM data and the RAM data without significantly increasing the memory that needs to be allocated for the storage of key values.

Figure 2D:
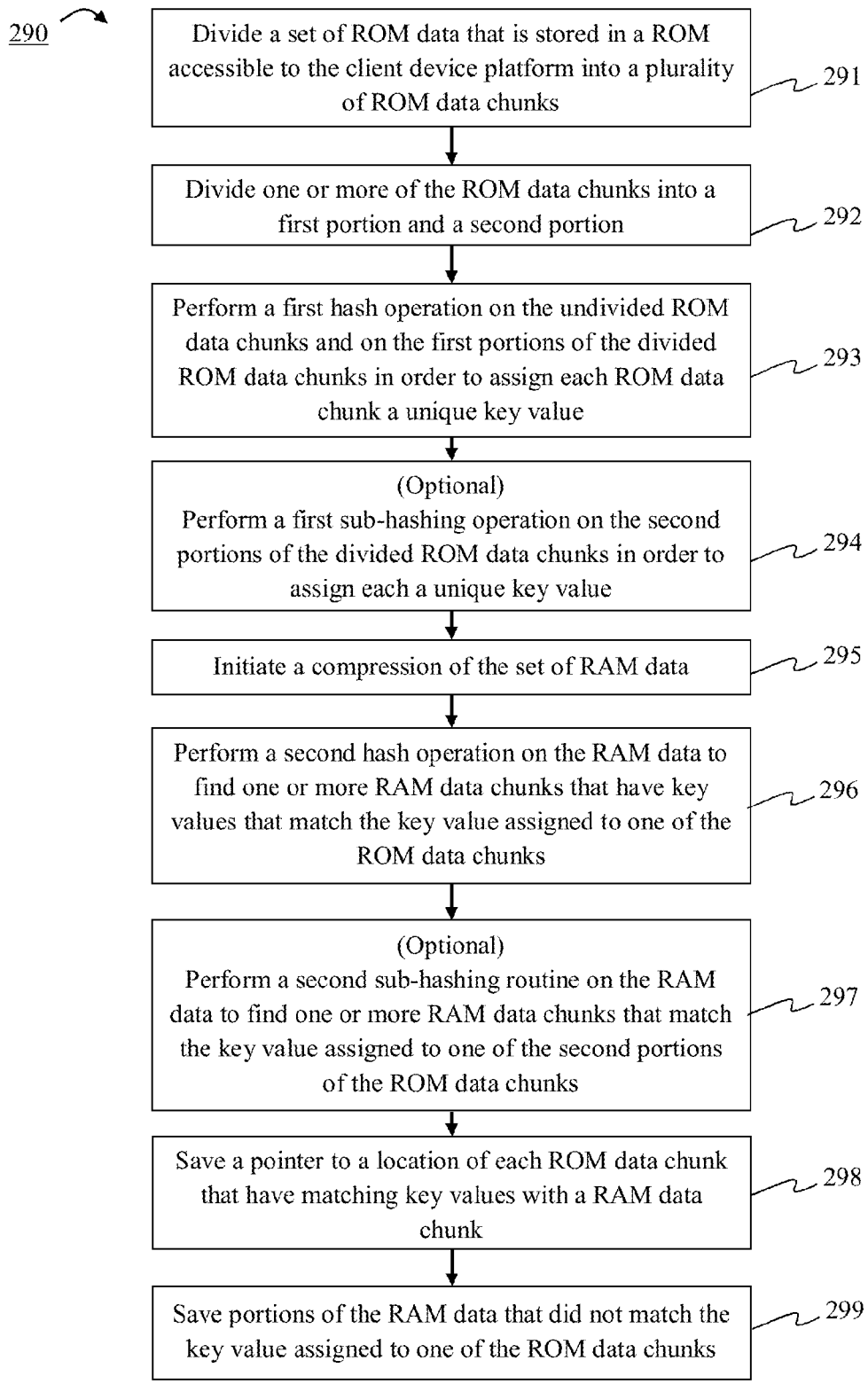

Initially machine learning may be used to monitor the RAM offline in a similar manner to that described above with respect to method 280. However, instead of identifying essential and non-essential data, the machine learning may be used to identify RAM data chunks 315 that are substantially similar to a ROM data chunks 307 except for a small sub-portion 312 in the RAM data chunk 315 that is often (but not necessarily always) different than the corresponding sub-portion 311 in the ROM data chunk 307. Once these sub-portions 312 have been identified, method 290 shown in FIG. 2D may be implemented.

Figure 3C:
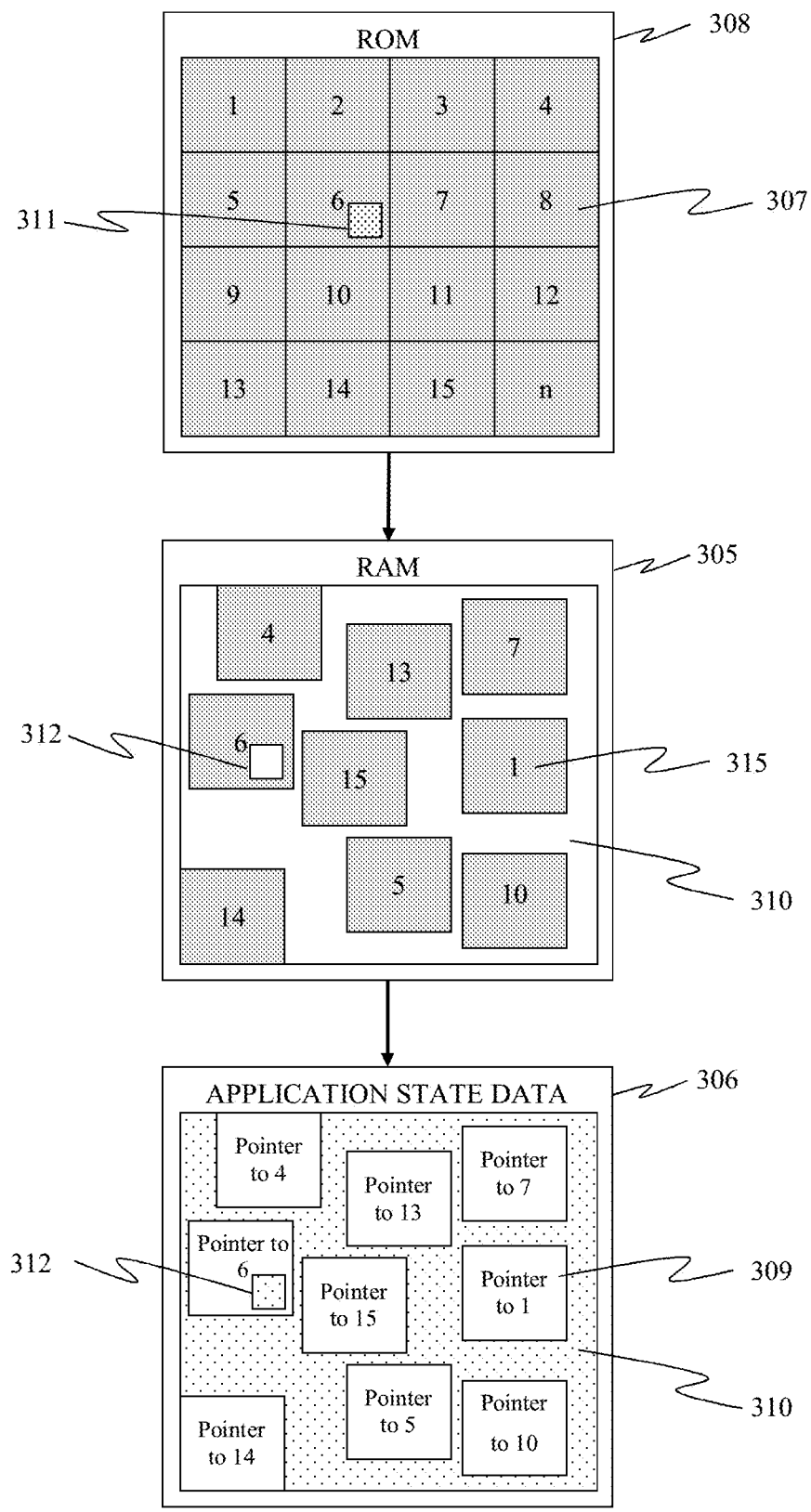

First, at block 291 a set of ROM data that is stored in a ROM accessible to the client device platform 102 is divided into a plurality of ROM data chunks. Thereafter, at block 292 one or more of the ROM data chunks are divided into a first portion 307 and a second portion 311. The second portion 311 may be the portion of the ROM data chunk 307 that has been recognized by the machine learning to have a higher probability of not being matched by a corresponding portion of a RAM data chunk 312. In FIG. 3C a simplified block diagram shows the first and second portions of the sixth ROM data chunk.

After dividing the ROM data chunks into first and second portions, at block 293 method 290 continues by performing a first hash operation on the undivided ROM data chunks 307 and on the first portions of the divided ROM data chunks 307 in order to assign each a unique key value. Thereafter, at block 294 an optional first sub-hashing operation may be performed on the second portions of the divided ROM data chunks 311 in order to assign each sub-portion a unique key value. This step is optional, because it may not be worthwhile to try and match the sub-portions because of their higher likelihood of not being matched. Since there is likely no match, the process of checking to see if there is a match may result in a wasted use of resources.

Once the ROM data 304 has been hashed, the method continues to block 295 where a compression process is initiated. The initiation of the compression process is substantially similar to step described in block 263 of method 260. Next, at block 296 a second hash operation on the RAM data 305 is performed to find one or more RAM data chunks 315 that match the key value assigned to one of the undivided ROM data chunks 307 or the first portion of a divided ROM data chunk 307. The removal of the sub-portions 311 that have a higher probability of not being matched increases the likelihood of finding RAM data chunks 315 that match the ROM data chunks 307, and therefore improves the compression. As shown in FIG. 3C, the sixth RAM data chunk 315 matches the first portion of the ROM data chunk 307. Had the sub-portion 311 of the ROM data chunk been included in the first hashing operation, then the sixth RAM data block 315 would not have been a match, and the entire block of data would have needed to be saved instead of just the pointer.

After the second hash operation, another optional step may be implemented at block 297. If the first sub-hashing operation was performed at block 294, then a second sub-hashing operation may be performed on the RAM data 305 in order to try and find one or more RAM data chunks that match the key value assigned to one of the second portions of the ROM data chunks. Thereafter, at blocks 298 and 299 are performed in substantially the same manner as blocks 265 and 266 of method 260.

Figure 4A:
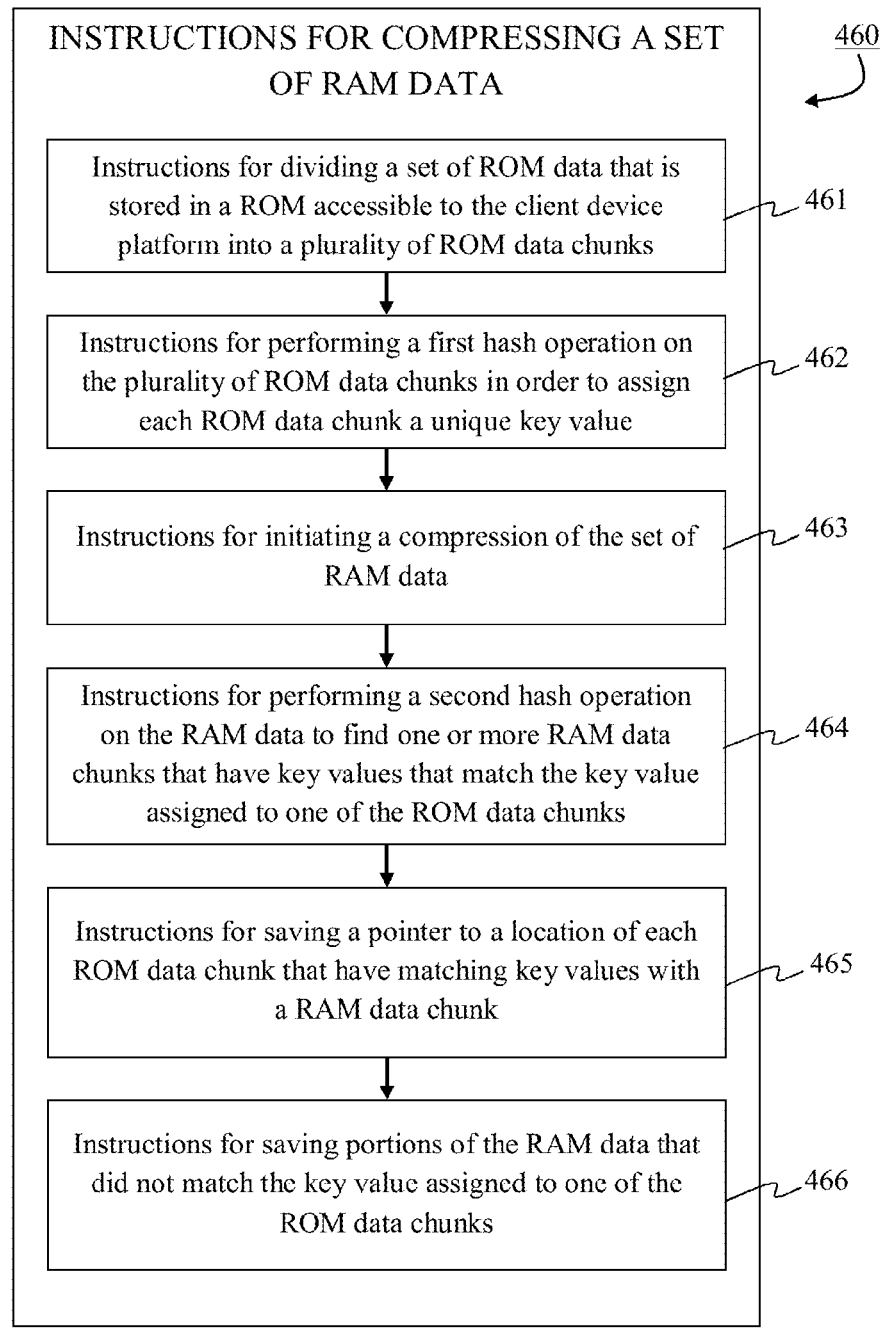
FIGS. 4A-4D are block diagrams that depict instructions for compressing state information that may be stored on a non-transitory computer readable medium according to aspects of the present disclosure.

As shown in FIG. 4A, a set of client device platform instructions 460 may be implemented, e.g., by the client device platform 102. The client device platform instructions 460 may be formed on a nontransitory computer readable medium such as the memory 132 or the mass storage device 134. The client device platform instructions 460 may also be part of the process control program 133. The instructions include instructions for dividing a set of ROM data that is stored in a ROM accessible to the client device platform into a plurality of ROM data chunks at block 461. Then at block 462 there may be instructions for performing a first hash operation on the plurality of ROM data chunks in order to assign each ROM data chunk a unique key value. Next, at block 463 there may be instructions for initiating a compression of the set of RAM data. Thereafter at block 464 there may be instructions for performing a second hash operation on the RAM data to find one or more RAM data chunks that have key values that match the key value assigned to one of the ROM data chunks. Instructions for saving a pointer to a location of each ROM data chunk that have matching key values with a RAM data chunk may then be included at block 465. Finally, at block 466 there may be instructions for saving portions of the RAM data that did not match the key value assigned to one of the ROM data chunks.

Figure 4B:
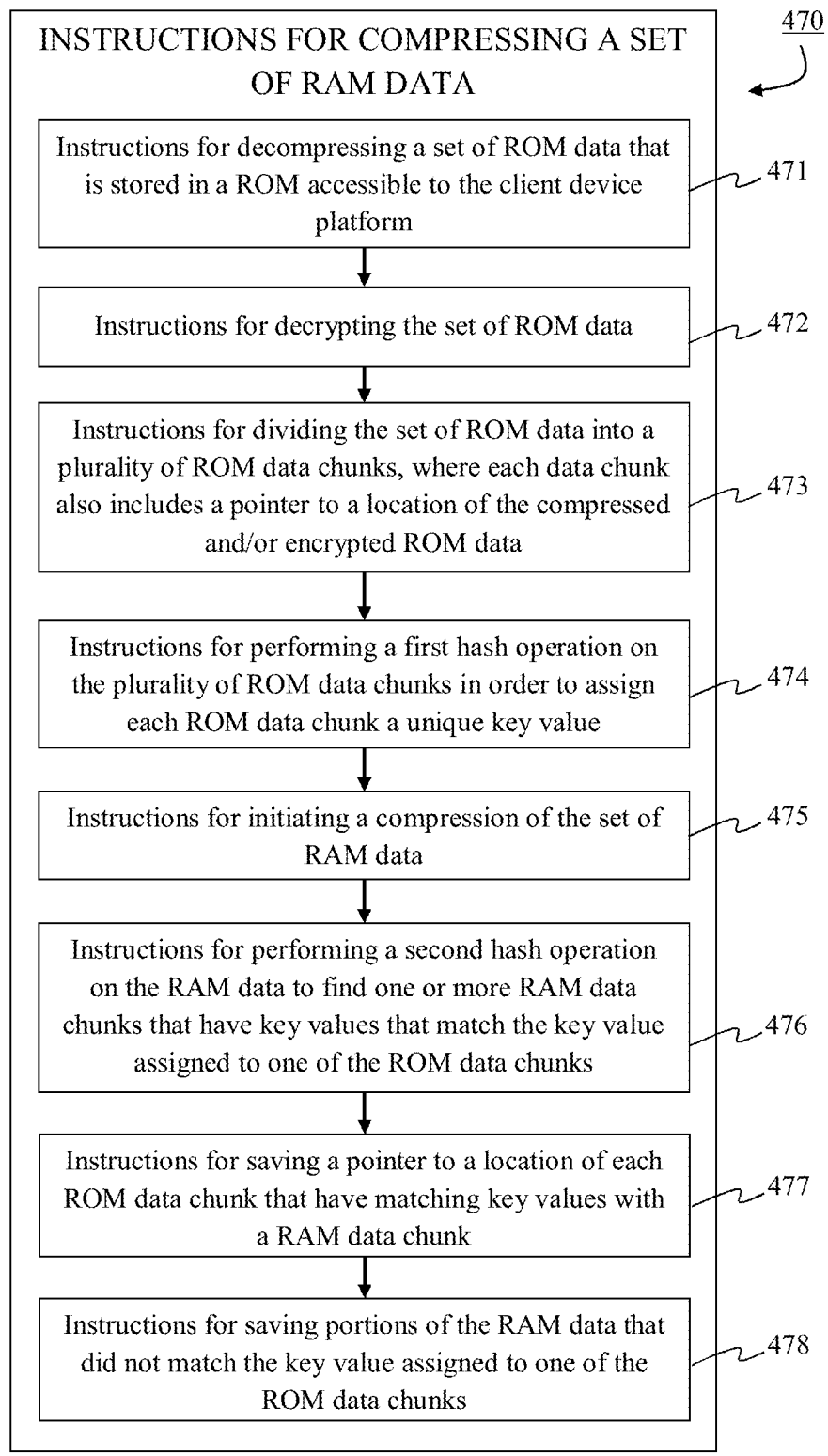

As shown in FIG. 4B, a set of client device platform instructions 470 may be implemented, e.g., by the client device platform 102. The client device platform instructions 470 may be formed on a nontransitory computer readable medium such as the memory 132 or the mass storage device 134. The client device platform instructions 470 may also be part of the process control program 133. The instructions may include instructions for decompressing a set of ROM data that is stored in a ROM accessible to the client device platform at block 471. Next, at block 472 there may be instructions for decrypting the set of ROM data. Thereafter, at block 473 the instructions may include instructions for dividing the set of ROM data into a plurality of ROM data chunks, where each data chunk also includes a pointer to a location of the compressed and/or encrypted ROM data. Thereafter, the remaining instructions 474 through 478 of the client device platform instruction 470 are substantially similar to the instructions described in blocks 462-466 of client device platform instructions 460.

Figure 4C:
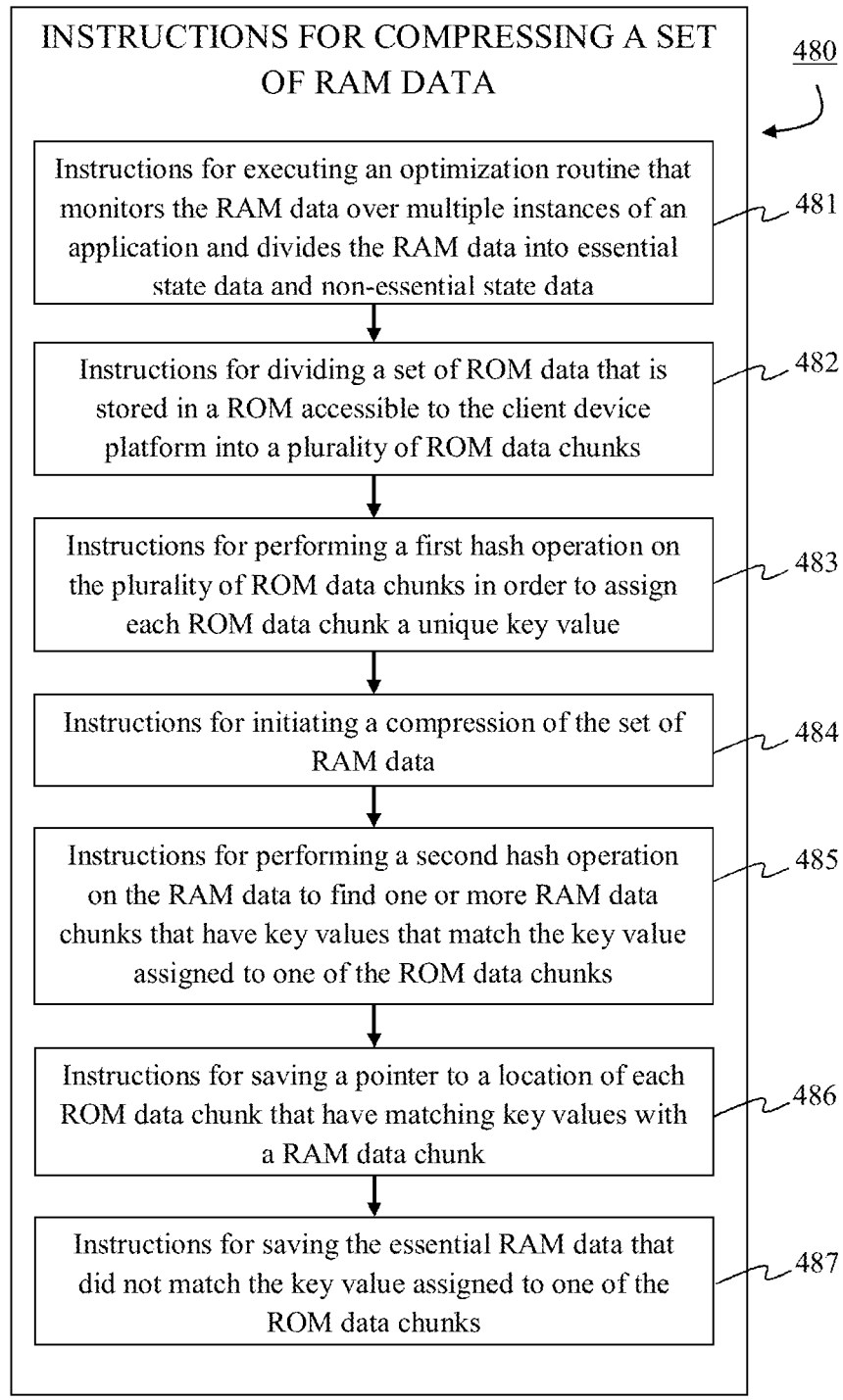

As shown in FIG. 4C, a set of client device platform instructions 480 may be implemented, e.g., by the client device platform 102. The client device platform instructions 480 may be formed on a nontransitory computer readable medium such as the memory 132 or the mass storage device 134. The client device platform instructions 480 may also be part of the process control program 133. The instructions may include instructions for executing an optimization routine that monitors the RAM data over multiple instances of an application and divides the RAM data into essential state data and non-essential state data at block 481. Next, at block 482 the instructions may include instructions for dividing a set of ROM data that is stored in a ROM accessible to the client device platform into a plurality of ROM data chunks. Thereafter, at block 483 there may be instructions for performing a first hash operation on the plurality of ROM data chunks in order to assign each ROM data chunk a unique key value. Then, at block 484 there may be instructions for initiating a compression of the set of RAM data. Then, at block 485, there may be instructions for performing a second hash operation on the RAM data to find one or more RAM data chunks that have key values that match the key value assigned to one of the ROM data chunks. Next, at block 486, there may be instructions for saving a pointer to a location of each ROM data chunk that have matching key values with a RAM data chunk. Finally, at block 487 there may be instructions for saving the essential RAM data that did not match the key value assigned to one of the ROM data chunks.

Figure 4D:
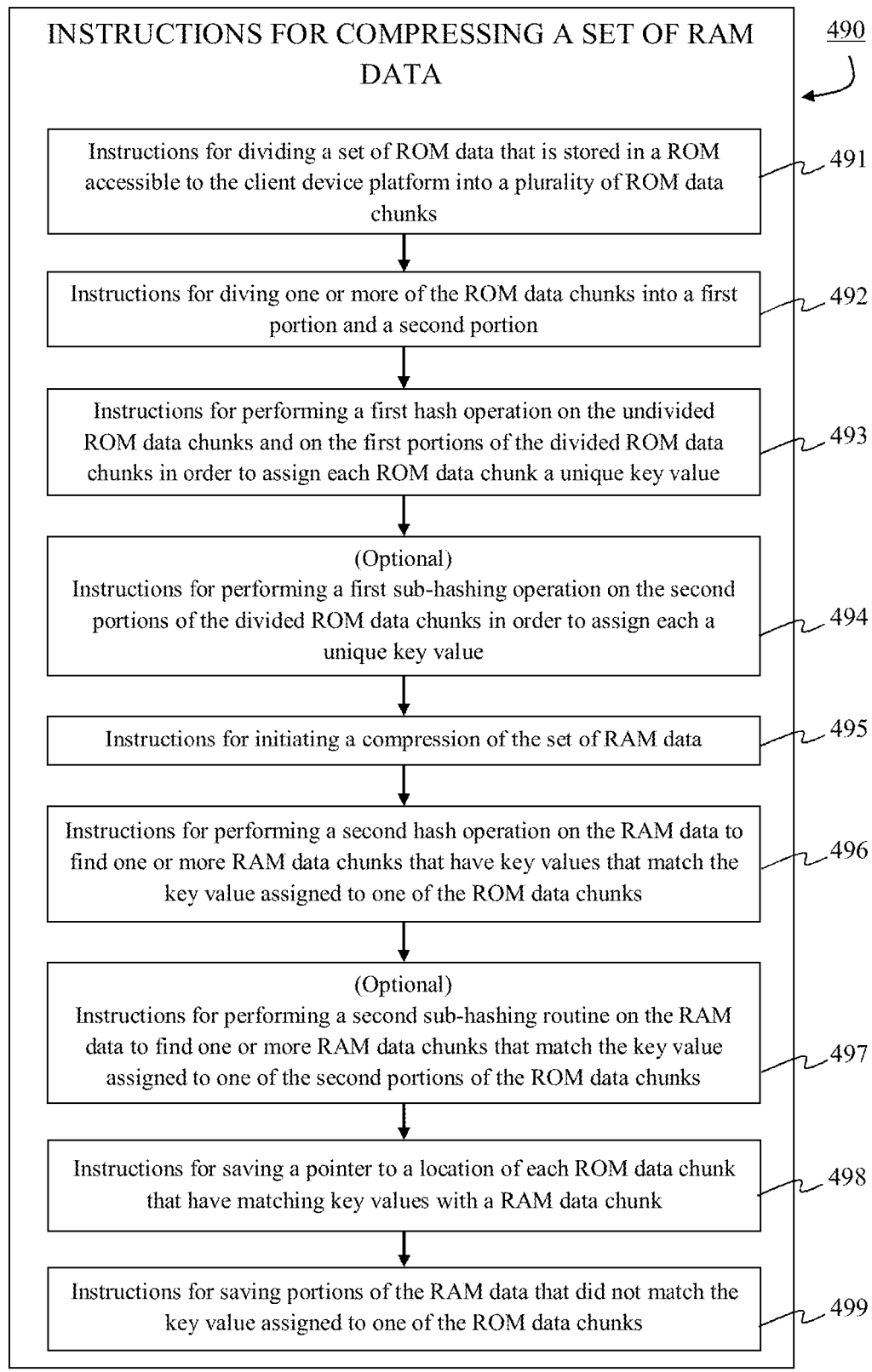

As shown in FIG. 4D, a set of client device platform instructions 490 may be implemented, e.g., by the client device platform 102. The client device platform instructions 490 may be formed on a nontransitory computer readable medium such as the memory 132 or the mass storage device 134. The client device platform instructions 490 may also be part of the process control program 133. The instructions may include instructions for dividing a set of ROM data that is stored in a ROM accessible to the client device platform into a plurality of ROM data chunks at block 491. There may then be instructions for dividing one or more of the ROM data chunks into a first portion and a second portion at block 492. Next, at block 493 there may be instructions for performing a first hash operation on the undivided ROM data chunks and on the first portions of the divided ROM data chunks in order to assign each ROM data chunk a unique key value. Then, at block 494 there may be optional instructions for performing a first sub-hashing operation on the second portions of the divided ROM data chunks in order to assign each a unique key value. Thereafter, at block 495, there may be instructions for initiating a compression of the set of RAM data. Then, instructions for performing a second hash operation on the RAM data to find one or more RAM data chunks that have key values that match the key value assigned to one of the ROM data chunks may be included at block 496. Then another optional instruction for performing a second sub-hashing routine on the RAM data to find one or more RAM data chunks that match the key value assigned to one of the second portions of the ROM data chunks may be included at block 497. At block 498 there may be instructions for saving a pointer to a location of each ROM data chunk that have matching key values with a RAM data chunk. Finally, at block 499 there may be instructions for saving portions of the RAM data that did not match the key value assigned to one of the ROM data chunks.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. In a client device platform, a method, comprising:
dividing a first set of data that is stored in a first memory accessible to a client device platform into a plurality of first memory data chunks;
performing a first hash operation on the plurality of first memory data chunks in order to assign each first memory data chunk a unique hash key value;
initiating a compression of a second set of data stored in a second memory that is accessible to the client device platform;
performing a second hash operation on the second set of data to find one or more second memory data chunks that have hash key values that match the hash key value assigned to one of the first memory data chunks;
saving a pointer to a location of each first memory data chunk that have matching hash key values with a second memory data chunk; and
saving those portions of the second memory data chunks that did not have a hash key value that matched the unique hash key value assigned to one of the first memory data chunks.

2. The method of claim 1, further comprising:
decompressing the set of first memory data before dividing the set of first memory data into a plurality of first memory data chunks; wherein
the pointer in the first memory data chunk points to a location in the compressed version of the first memory data where each first memory data chunk originated from.

3. The method of claim 1, further comprising:
decrypting the set of first memory data before dividing the set of first memory data into a plurality of first memory data chunks; wherein
the pointer in the first memory data chunk points to a location in the encrypted first memory data where each first memory data chunk originated from.

4. The method of claim 1, further comprising:
executing an optimization routine before the initiation of the compression of the second memory data that monitors the changes in the second memory data over a plurality of instances of an application that utilizes the second memory data and divides the second memory data into essential state data and non-essential state data.

5. The method of claim 4, further comprising:
saving only the essential state data of those portions of the second memory data that did not have a hash key value that matched the hash key value assigned to one of the first memory data chunks to a first memory data chunk.

6. The method of claim 1, wherein one or more of the first memory data chunks are divided into a first portion and a second portion, wherein the second portion is not hashed during the first hash operation, and wherein the second portion of the first memory data chunk has a higher probability of having a hash key value that is not matched by a second memory data chunk.

7. The method of claim 6, further comprising:
performing a first sub-hashing routine on the second portions of the first memory data chunks in order to assign each second portion of first memory data chunks a unique hash key value.

8. The method of claim 7, further comprising:
performing a second sub-hashing routine on the second memory data to find one or more second memory data chunks that match the hash key value assigned to one of the second portions of the first memory data chunks.

9. The method of claim 1, wherein the compression is initiated by a user initiated request to pause an application utilizing the second memory data.

10. The method of claim 1, wherein the compression is continuously initiated in order to deliver the second memory data over a network connection.

11. The method of claim 10, wherein the second memory data is delivered to a cloud based server.

12. The method of claim 1, further comprising send a saved application state over a network, wherein the saved application state includes pointers to one or more locations of one or more corresponding first memory data chunks that have matching hash key values with one or more corresponding second memory data chunks and one or more portions of second memory data that did not match one or more corresponding hash key values assigned to one or more corresponding first memory data chunks.

13. The method of claim 1, wherein the second memory data includes states of two or more applications.

14. The method of claim 13, wherein the states of the two or more applications are saved simultaneously.

15. The method of claim 1, wherein the first set of data stored in the first memory does not change over time.

16. The method of claim 1, wherein the second set of data in the second memory changes over time.

17. A nontransitory computer readable medium containing program instructions, wherein execution of the program instructions by one or more processors of a computer system causes the one or more processors to carry out the steps of:
dividing a first set of data that is stored in a first memory accessible to a client device platform into a plurality of first memory data chunks;
performing a first hash operation on the plurality of first memory data chunks in order to assign each first memory data chunk a unique hash key value;
initiating a compression of a second set of data stored in a second memory that is accessible to the client device platform;
performing a second hash operation on the second set of data to find one or more second memory data chunks that have hash key values that match the hash key value assigned to one of the first memory data chunks;
saving a pointer to a location of each first memory data chunk that have matching hash key values with a second memory data chunk; and
saving those portions of the second memory data chunks that did not have a hash key value that matched the unique hash key value assigned to one of the first memory data chunks.

18. A client device platform comprising:
a processor;
a memory coupled to the processor;
one or more instructions embodied in memory for execution by the processor, wherein execution of the instructions the processor causes the one or more processor to carry out the steps of:
dividing a first set of data that is stored in a first memory accessible to a client device platform into a plurality of first memory data chunks;
performing a first hash operation on the plurality of first memory data chunks in order to assign each first memory data chunk a unique hash key value;
initiating a compression of a second set of data stored in a second memory that is accessible to the client device platform;
performing a second hash operation on the second set of data to find one or more second memory data chunks that have hash key values that match the hash key value assigned to one of the first memory data chunks;
saving a pointer to a location of each first memory data chunk that have matching hash key values with a second memory data chunk; and
saving those portions of the second memory data chunks that did not have a hash key value that matched the unique hash key value assigned to one of the first memory data chunks.

* * * * *